(12) United States Patent
Ahn et al.

(10) Patent No.: US 7,833,840 B2
(45) Date of Patent: Nov. 16, 2010

(54) INTEGRATED CIRCUIT PACKAGE SYSTEM WITH DOWN-SET DIE PAD AND METHOD OF MANUFACTURE THEREOF

(75) Inventors: Byung Hoon Ahn, Singapore (SG); OhSug Kim, Kyungkido (KR)

(73) Assignee: Stats Chippac Ltd., Singapore (SG)

( * ) Notice: Subject to any disclaimer, the term of this patent is extended or adjusted under 35 U.S.C. 154(b) by 126 days.

(21) Appl. No.: 11/462,247

(22) Filed: Aug. 3, 2006

(65) Prior Publication Data
US 2008/0032456 A1   Feb. 7, 2008

(51) Int. Cl.
*H01L 21/00*    (2006.01)
*H01L 29/06*    (2006.01)
*H01R 9/00*     (2006.01)

(52) U.S. Cl. ............... 438/123; 257/623; 257/676; 257/782; 257/E21.506; 257/E23.031; 257/E23.043; 257/E23.045; 361/774; 361/813

(58) Field of Classification Search .......... 257/666–676
See application file for complete search history.

(56) References Cited

U.S. PATENT DOCUMENTS

| | | | | |
|---|---|---|---|---|
| 5,212,403 A | * | 5/1993 | Nakanishi et al. ......... | 257/664 |
| 5,583,377 A | * | 12/1996 | Higgins, III ............ | 257/707 |
| 5,594,234 A | | 1/1997 | Carter, Jr. et al. | |
| 5,717,252 A | * | 2/1998 | Nakashima et al. ........ | 257/707 |
| 5,929,514 A | | 7/1999 | Yalamanchili | |
| 6,291,892 B1 | * | 9/2001 | Yamaguchi ............. | 257/778 |
| 6,353,326 B2 | * | 3/2002 | Hembree et al. ......... | 324/755 |
| 6,537,848 B2 | * | 3/2003 | Camenforte et al. ...... | 438/106 |
| 6,900,535 B2 | * | 5/2005 | Zhou ................... | 257/707 |
| 6,906,414 B2 | * | 6/2005 | Zhao et al. ............. | 257/707 |
| 6,921,980 B2 | | 7/2005 | Nakanishi et al. | |
| 6,924,537 B2 | | 8/2005 | Otani | |
| 7,154,166 B2 | * | 12/2006 | Ano .................... | 257/676 |
| 7,671,463 B2 | * | 3/2010 | Camacho et al. ......... | 257/692 |
| 2003/0206401 A1 | * | 11/2003 | Zhou ................... | 361/719 |

\* cited by examiner

*Primary Examiner*—Alonzo Chambliss
(74) *Attorney, Agent, or Firm*—Mikio Ishimaru (57) ABSTRACT

An integrated circuit package system and method of manufacture therefor includes providing a substrate with a beveled cavity, attaching a down-set conductive die pad with tapered sidewalls for matching with the beveled cavity in the substrate and having the down-set below a lower surface of the substrate, and attaching an integrated circuit over the down-set conductive die pad and electrically connected thereto.

20 Claims, 8 Drawing Sheets

INTEGRATED CIRCUIT PACKAGE SYSTEM WITH DOWN-SET DIE PAD AND METHOD OF MANUFACTURE THEREOF

TECHNICAL FIELD

The present invention relates generally to package systems, and more particularly to a system for integrated circuit packages.

BACKGROUND ART

Many chips or die with integrated circuits are contained in electronic devices. Within the integrated circuit industry, there is a continuing effort to increase integrated circuit device density and speed. As integrated circuits become smaller, the number of interconnections and the amount of heat generated per square inch may increase accordingly. Increased heating of an integrated circuit device may affect the performance of the device and may cause permanent damage. Semiconductor packages may be designed to address some of these issues.

An important function carried out by the substrate is that of dissipating heat generated by the die during operation. A multilayer substrate is desirable because it allows increased circuit design flexibility; however, this can also increase the path required for thermal conduction, which decreases the heat dissipating ability of the package. In general, the substrate provides a thermal conduction path away from the die by way of the substrate die pad through vias connecting the substrate die pad to the heat spreader, and through the heat spreader to, for example, a printed circuit board.

However, due to the arrangement of conventional substrates as well as the fabrication process associated with conventional substrates, the thermal conduction path through the semiconductor package is severely limited. By way of example, thermal conduction is particularly limited in multilayer substrates. Due to inefficient thermal conduction, heat dissipation is severely limited and, therefore, semiconductor devices using such packages can suffer from poor performance and poor package reliability.

For example, a flip chip package may accommodate interconnection requirements of high-density integrated circuits. In a typical flip chip package, an integrated circuit may be mounted to the top surface of a package substrate that serves as an interconnection device. The package substrate typically consists of top and bottom surface buildup layers of interconnect circuitry disposed on a substrate core. As current is passed through the top and bottom buildup layers, heat may be generated, which may cause the package substrate to self-heat. The substrate core is typically made of an organic material that is not thermally conductive, and so acts as a thermal insulator to the buildup layers.

A current solution to remove heat from a flip chip package is to attach a heat spreader in thermal contact with a backside surface of the integrated circuit. The heat spreader is typically attached to a solder resist area around the perimeter of the top buildup layers. Because the solder resist area is not thermally conductive, there may be no path for heat transfer from a self-heated package substrate to the heat spreader. Therefore, the heat spreader may do little to remove heat from the self-heated package substrate. The heat spreader also adds undesirable size to the dimensions of the package as well as the space requirements within the system and product. Multiple integrated circuits or packages only exacerbate the issues with heat transfer and constraints of size.

Across virtually all applications, there continues to be growing demand for reducing size and increasing performance of integrated circuits. The seemingly endless restrictions and requirements are no more visible than with products in our daily lives. Smaller and denser integrated circuits are required in many portable electronic products, such as cell phones, portable computers, voice recorders, etc. as well as in many larger electronic systems, such as cars, planes, industrial control systems, etc. As the demand grows for smaller electronic products with more features, manufacturers are seeking ways to include more features, reduce the size, and improve the thermal performance of the integrated circuit packages.

Thus, a need still remains for an integrated circuit package system to provide improved thermal performance, function, area, volume, and manufacturing yield. In view of the increasing demand for improved integrated circuits and particularly more functions in smaller products at lower costs, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a substrate with a beveled cavity, attaching a down-set conductive die pad with tapered sidewalls for matching with the beveled cavity in the substrate and having the down-set below a lower surface of the substrate, and attaching an integrated circuit over the down-set conductive die pad and electrically connected thereto.

The present invention provides an integrated circuit package system including a substrate with a beveled cavity; a down-set conductive die pad with tapered sidewalls matched with the beveled cavity in the substrate and having the down-set below a lower surface of the substrate; and an integrated circuit over the down-set conductive die and electrically connected thereto.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the invention with surfaces as oriented downward, this arrangement in the FIGs. is arbitrary and is not intended to suggest that invention should necessarily be in a downward direction. Generally, the device can be operated in any orientation. In addition, the same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "on" refers to direct contact among the elements.

The term "processing" as used herein includes deposition of material or photoresist, patterning, exposure, development, etching, cleaning, and/or removal of the material or photoresist as required in forming a described structure.

Figure 1:
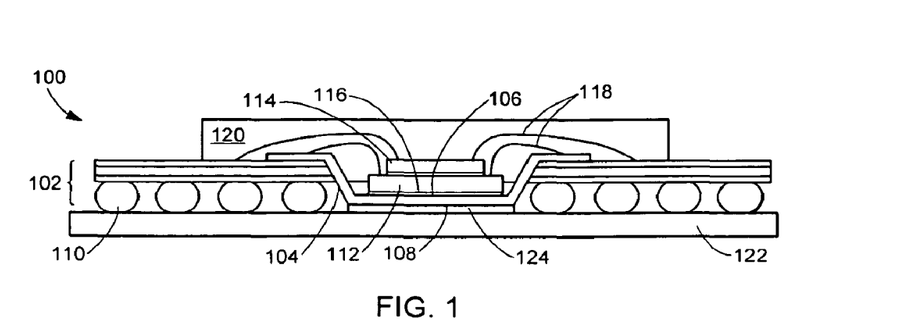
FIG. 1 is a cross-sectional view of an integrated circuit package system in an embodiment of the present invention.

Referring now to FIG. 1, therein is shown a cross-sectional view of an integrated circuit package system 100 in an embodiment of the present invention. The integrated circuit package system 100 includes a substrate 102 with a beveled cavity for matching with a down-set conductive die pad 104 with tapered sidewalls having a deep down-set below a lower surface of the substrate 102. The down-set conductive die pad 104 also provides a die pad surface 106 opposite an exposed surface 108. The die pad surface 106 provides a mounting surface and the exposed surface 108 provides thermal transfer. For illustrative purposes, four rows of substrate connectors 110 are shown, although it is understood that any number of rows or the substrate connectors 110 may be used.

A first integrated circuit 112 is attached to the down-set conductive die pad 104 and a second integrated circuit 114 is attached to the first integrated circuit 112 with a die attach material 116. Die connectors 118, such as bond wires, connect the first integrated circuit 112 to the down-set conductive die pad 104 and the second integrated circuit 114 to the substrate 102. The down-set conductive die pad 104 provides a recess for the first integrated circuit 112 and the second integrated circuit 114 allowing an improved height of the die connectors 118. It has been discovered that the improved height of the die connectors 118 provides a significantly improved package profile.

The integrated circuit package system 100 can include an encapsulant 120 over the die connectors 118, the first integrated circuit 112, the second integrated circuit 114, and the down-set conductive die pad 104. The encapsulant 120 provides protection for the integrated circuit package system 100 during further processing and in a next level system. The integrated circuit package system 100 can be attached to a system substrate 122, such as a printed circuit board, with an attachment material 124, such as a conductive adhesive, between the exposed surface 108 and the system substrate 122. It has been discovered that the down-set conductive die pad 104 with an exposed surface significantly improved thermal performance through conduction heat transfer.

Figure 2:
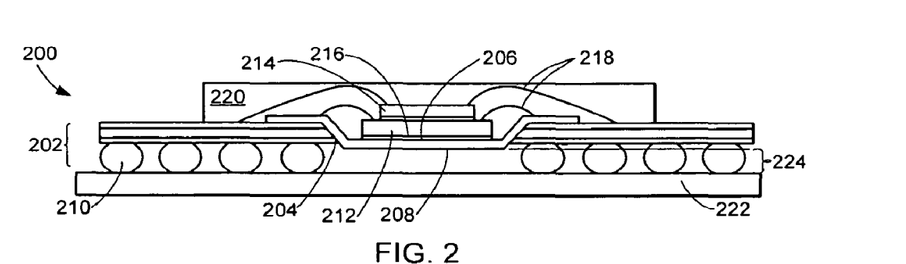
FIG. 2 is a cross-sectional view of an integrated circuit package system in an alternative embodiment of the present invention.

Referring now to FIG. 2, therein is shown a cross-sectional view of an integrated circuit package system 200 in an alternative embodiment of the present invention. In a manner similar to the integrated circuit package system 100 of FIG. 1, the integrated circuit package system 200 includes a substrate 202 with a cavity for a down-set conductive die pad 204 having a small down-set below an upper surface of the substrate 202. The down-set conductive die pad 204 also provides a die pad surface 206 opposite an exposed surface 208. The die pad surface 206 provides a mounting surface and the exposed surface 208 provides thermal transfer. For illustrative purposes, four rows of substrate connectors 210 are shown, although it is understood that any number of rows or the substrate connectors 210 may be used.

A first integrated circuit 212 is attached to the down-set conductive die pad 204 and a second integrated circuit 214 is attached to the first integrated circuit 212 with a die attach material 216. Die connectors 218, such as bond wires, connect the first integrated circuit 212 to the down-set conductive die pad 204 and the second integrated circuit 214 to the substrate 202. The down-set conductive die pad 204 provides a recess for the first integrated circuit 212 and the second integrated circuit 214 allowing an improved height of the die connectors 218. It has been discovered that the improved height of the die connectors 218 provides an improved package profile.

The integrated circuit package system 200 can include an encapsulant 220 over the die connectors 218, the first integrated circuit 212, the second integrated circuit 214, and the down-set conductive die pad 204. The encapsulant 220 provides protection for the integrated circuit package system 200 during further processing and in a next level system. The integrated circuit package system 200 can be attached to a system substrate 222, such as a printed circuit board, with an exposed region 224 between the exposed surface 208 of the down-set conductive die pad 204 and the system substrate 222. It has been discovered that the exposed surface 208 provides significantly improved thermal performance through convection heat transfer.

Figure 3:
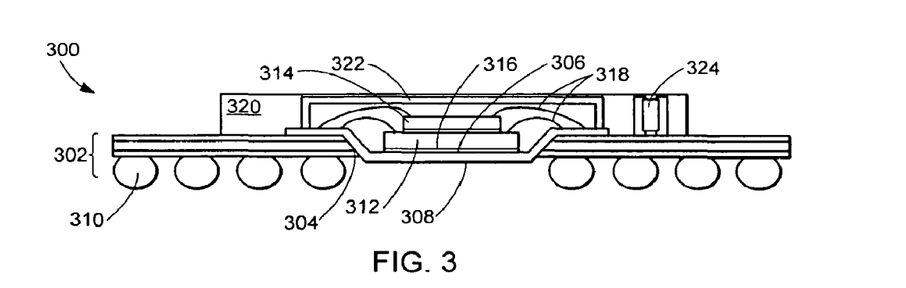
FIG. 3 is a cross-sectional view of an integrated circuit package system in another alternative embodiment of the present invention.

Referring now to FIG. 3, therein is shown a cross-sectional view of an integrated circuit package system 300 in another alternative embodiment of the present invention. In a manner similar to the integrated circuit package system 200 of FIG. 2, the integrated circuit package system 300 includes a substrate 302 with a cavity for a down-set conductive die pad 304 having a small down-set below an upper surface of the substrate 202. The down-set conductive die pad 304 also provides a die pad surface 306 opposite an exposed surface 308. The die pad surface 306 provides a mounting surface and the exposed surface 308 provides thermal transfer. For illustrative purposes, four rows of substrate connectors 310 are shown, although it is understood that any number of rows or the substrate connectors 310 may be used.

A first integrated circuit 312 is attached to the down-set conductive die pad 304 and a second integrated circuit 314 is attached to the first integrated circuit 312 with a die attach material 316. Die connectors 318, such as bond wires, connect the first integrated circuit 312 to the down-set conductive die pad 304 and the second integrated circuit 314 to the substrate 302. The down-set conductive die pad 304 provides a recess for the first integrated circuit 312 and the second integrated circuit 314 allowing an improved height of the die connectors 318. It has been discovered that the improved height of the die connectors 318 provides an improved package profile.

The integrated circuit package system 300 can include an encapsulant 320 over the die connectors 318, the first integrated circuit 312, the second integrated circuit 314, and the down-set conductive die pad 304. The encapsulant 320 provides protection for the integrated circuit package system 300 during further processing and in a next level system. The integrated circuit package system 300 includes a shield 322, such as a metal shield, and a passive device 324. The shield 322 and the passive device 324 can be attached to a ground signal to improve signal integrity. It has been discovered that the integrated circuit package system 300, with the down-set conductive die pad 304, the shield 322, and optionally the passive device 324, provides significantly improved electrical performance.

Figure 4:
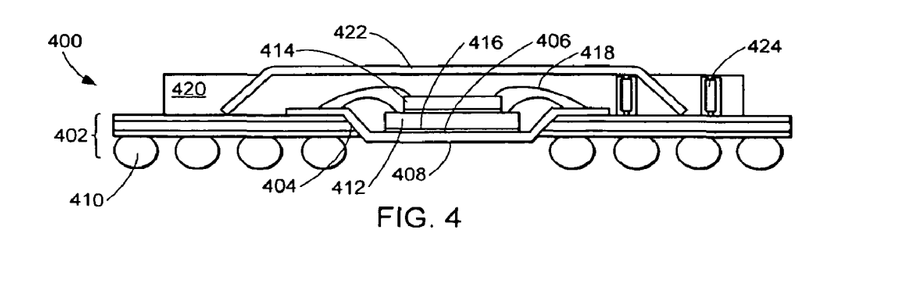
FIG. 4 is a cross-sectional view of an integrated circuit package system in yet another alternative embodiment of the present invention.

Referring now to FIG. 4, therein is shown a cross-sectional view of an integrated circuit package system 400 in yet another alternative embodiment of the present invention. In a manner similar to the integrated circuit package system 200 of FIG. 2, the integrated circuit package system 400 includes a substrate 402 with a cavity for a down-set conductive die pad 404 having a small down-set below an upper surface of the substrate 402. The down-set conductive die pad 404 also provides a die pad surface 406 opposite an exposed surface 408. The die pad surface 406 provides a mounting surface and the exposed surface 408 provides thermal transfer. For illustrative purposes, four rows of substrate connectors 410 are shown, although it is understood that any number of rows or the substrate connectors 410 may be used.

A first integrated circuit 412 is attached to the down-set conductive die pad 404 and a second integrated circuit 414 is attached to the first integrated circuit 412 with a die attach material 416. Die connectors 418, such as bond wires, connect the first integrated circuit 412 to the down-set conductive die pad 404 and the second integrated circuit 414 to the substrate 402. The down-set conductive die pad 404 provides a recess for the first integrated circuit 412 and the second integrated circuit 414 allowing an improved height of the die connectors 418. It has been discovered that the improved height of the die connectors 418 provides an improved package profile.

The integrated circuit package system 400 can include an encapsulant 420 over the die connectors 418, the first integrated circuit 412, the second integrated circuit 414, and the down-set conductive die pad 404. The encapsulant 420 provides protection for the integrated circuit package system 400 during further processing and in a next level system. The integrated circuit package system 400 includes a top heat sink 422 and passive devices 424. The passive devices 424 can be attached to a ground signal to improve signal integrity. It has been discovered that the integrated circuit package system 400, with the down-set conductive die pad 404, the top heat sink 422, and optionally the passive devices 424, provides significantly improved thermal performance and improved electrical performance.

Figure 5:
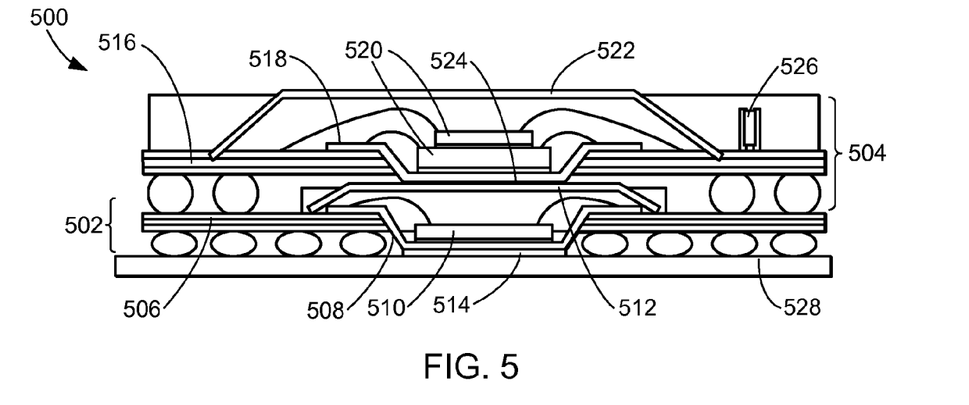
FIG. 5 is a cross-sectional view of an integrated circuit package system in yet another alternative embodiment of the present invention.

Referring now to FIG. 5, therein is shown a cross-sectional view of an integrated circuit package system 500 in yet another alternative embodiment of the present invention. The integrated circuit package system 500 includes a base package 502 and a top package 504. The base package 502 includes a base substrate 506 with a cavity for a base down-set conductive die pad 508, a base integrated circuit 510, a base heat sink 512, and a base attachment material 514. The top package 504 includes a top substrate 516 with a cavity for a top down-set conductive die pad 518, top integrated circuits 520. a top heat sink 522, a top attachment material 524, and optionally a passive device 526.

The base down-set conductive die pad 508 can be attached to a system substrate 528 with the base attachment material 514 to provide heat transfer for the base integrated circuit 510. The top package 504 can be attached to the base substrate 506 and the base heat sink 512 with the top attachment material 524 to provide heat transfer between the base package 502 and the top integrated circuits 520. Further heat transfer is provided by the top heat sink 522. It has been discovered that the integrated circuit package system 500, with the base down-set conductive die pad 508 and the top down-set conductive die pad 518, provides significantly improved thermal performance, a significantly improved package profile, and improved signal integrity.

Figure 6:
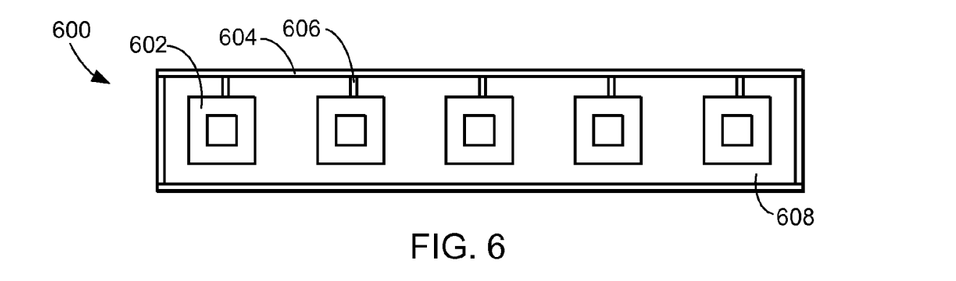
FIG. 6 is a plan view of a single guide rail array in an embodiment of the present invention.

Referring now to FIG. 6, therein is shown a plan view of a single guide rail array 600 in an embodiment of the present invention. The single guide rail array 600 includes down-set conductive die pads 602. Each of the down-set conductive die pads 602 are attached to a guide rail 604 with guide bars 606. The single guide rail array 600 includes one segment of the guide rail 604 with a number of the guide bars 606 to attach each of the down-set conductive die pads 602 to the guide rail 604.

The guide rail 604 provides structural integrity, including a substantially fixed position, to each of the down-set conductive die pads 602 during processing. The guide rail 604 and the guide bars 606 are substantially removed from each of the down-set conductive die pads 602 during further processing. The single guide rail array 600 is shown over a substrate 608. For illustrative purposes, four of the down-set conductive die pads 602 are shown, although it is understood that any number or configuration may be used.

Figure 7:
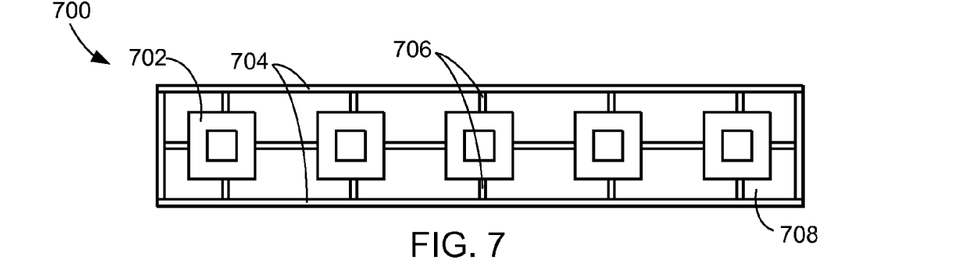
FIG. 7 is a plan view of a plan view of a double guide rail array in an embodiment of the present invention.

Referring now to FIG. 7, therein is shown a plan view of a double guide rail array 700 in an embodiment of the present invention. The double guide rail array 700 includes down-set conductive die pads 702. Each of the down-set conductive die pads 702 are attached to guide rails 704 with guide bars 706. The double guide rail array 700 includes two segments of the guide rails 704 with a number of the guide bars 706 to attach each of the down-set conductive die pads 702 to the guide rails 704.

The guide rails 704 provide significant structural integrity, including a substantially fixed position, to each of the down-set conductive die pads 702 during processing. The guide rails 704 and the guide bars 706 are substantially removed from each of the down-set conductive die pads 702 during further processing. The double guide rail array 700 is shown over a substrate 708. For illustrative purposes, four of the down-set conductive die pads 702 are shown, although it is understood that any number or configuration may be used.

Figure 8:
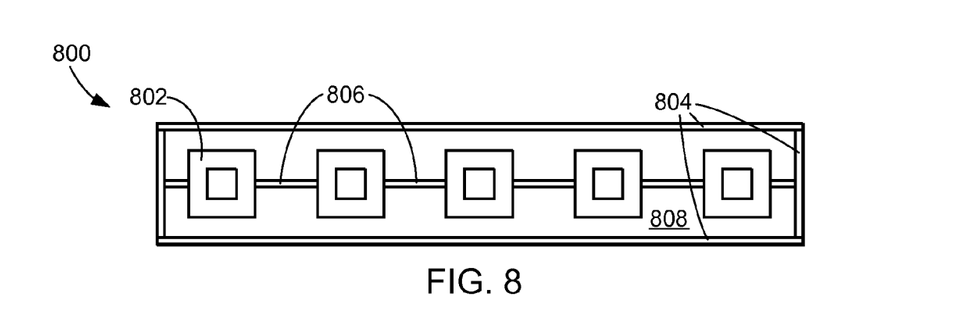
FIG. 8 is a plan view of an outer guide rail array in an embodiment of the present invention.

Referring now to FIG. 8, therein is shown a plan view of an outer guide rail array 800 in an embodiment of the present invention. The outer guide rail array 800 includes down-set conductive die pads 802. Each of the down-set conductive die pads 802 are attached to guide rails 804 with guide bars 806. The outer guide rail array 800 includes four segments of the guide rails 804 with a number of the guide bars 806 to attach each of the down-set conductive die pads 802 to the guide rails 804.

The guide rails 804 provide significant structural integrity, including a substantially fixed position, to each of the down-set conductive die pads 802 during processing. The guide rails 804 and the guide bars 806 are substantially removed from each of the down-set conductive die pads 802 during further processing. The outer guide rail array 800 is shown over a substrate 808. For illustrative purposes, four of the down-set conductive die pads 802 are shown, although it is understood that any number or configuration may be used.

Figure 9:
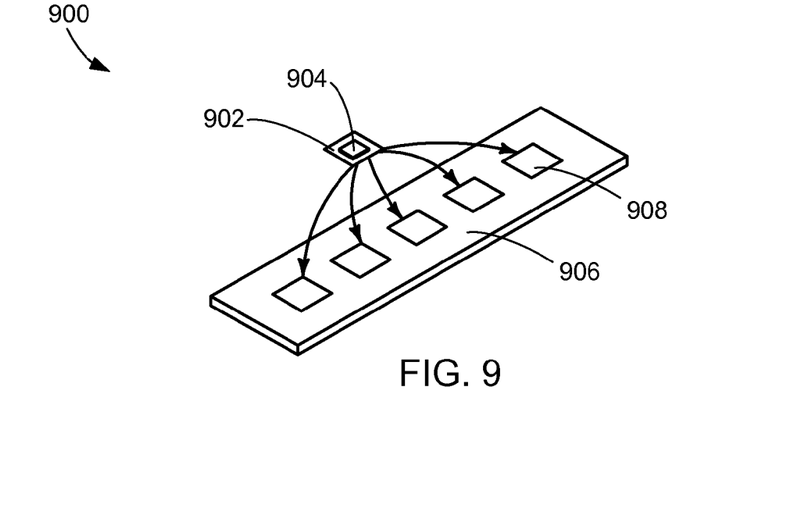
FIG. 9 is an isometric view of an integrated circuit package system in a die pad preparing phase.

Referring now to FIG. 9, therein is shown an isometric view of an integrated circuit package system 900 in a die pad preparing phase. The integrated circuit package system 900 includes down-set conductive die pads 902 with an exposed surface 904. The down-set conductive die pads 902 can be provided on a film (not shown), such as a dry film. The down-set conductive die pads 902 are placed on a jig 906, such as a heating jig. The jig 906 includes a jig cavity 908 for the down-set conductive die pads 902. An attachment material (not shown), such as an adhesive, is applied around the exposed surface 904 of the down-set conductive die pads 902.

Figure 10:
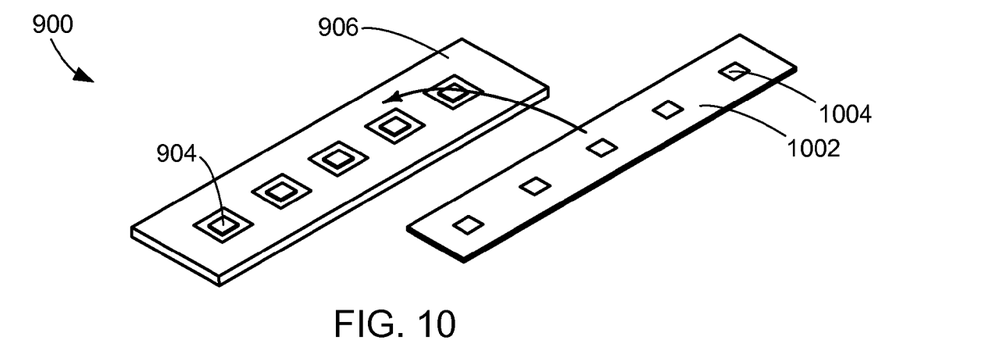
FIG. 10 is an isometric view of the integrated circuit package system in a die pad mounting phase.

Referring now to FIG. 10, therein is shown an isometric view of the integrated circuit package system 900 in a die pad mounting phase. A substrate 1002 is placed over the attachment material (not shown) on the down-set conductive die pads 902 over the jig 906. The substrate 1002 includes a substrate cavity 1004 for the down-set conductive die pads 902. The substrate cavity 1004 is placed around the exposed surface 904 of the down-set conductive die pads 902. The substrate 1002 and the down-set conductive die pads 902 provide the mounting surfaces for the integrated circuit package system 900.

Figure 11:
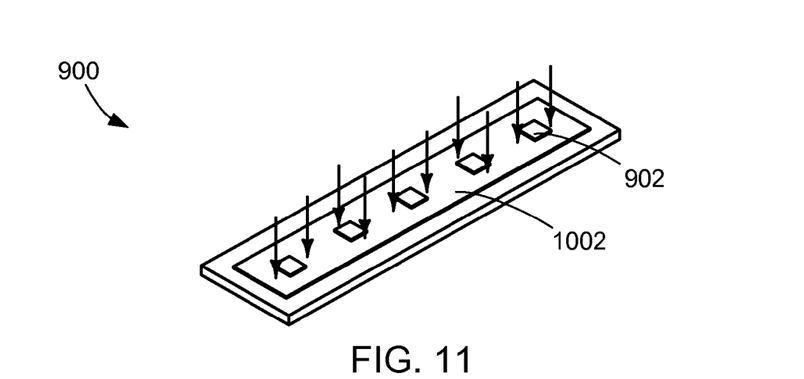
FIG. 11 is an isometric view of the integrated circuit package system in an attaching phase.

Referring now to FIG. 11, therein is shown an isometric view of the integrated circuit package system 900 in an attaching phase. A clamping tool (not shown), such as a pick up tool, presses the substrate 1002 and the down-set conductive die pads 902 together. The clamping tool ensures the attachment material (not shown) adheres to the substrate 1002 and the down-set conductive die pads 902. The attachment material provides sufficient adhesive force between the substrate 1002 and each of the down-set conductive die pads 902 to maintain attachment during further processing, such as singulation.

Figure 12:
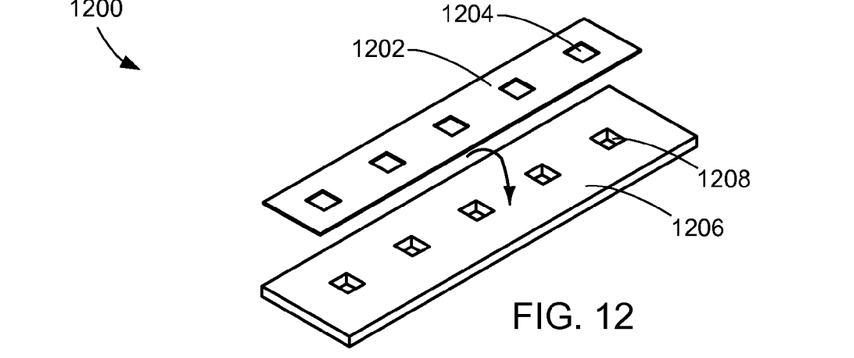
FIG. 12 is an isometric view of an integrated circuit package system in a substrate preparing phase.

Referring now to FIG. 12, therein is shown an isometric view of an integrated circuit package system 1200 in a substrate preparing phase. The integrated circuit package system 1200 includes a substrate 1202 with a substrate cavity 1204. The substrate 1202 can be provided on a film (not shown), such as a dry film. The substrate 1202 is placed on a jig 1206, such as a heating jig. The jig 1206 can include a jig cavity 1208. An attachment material (not shown), such as an adhesive, is applied to the substrate 1202. The attachment material is applied on an area of the substrate 1202 near the substrate cavity 1204.

Figure 13:
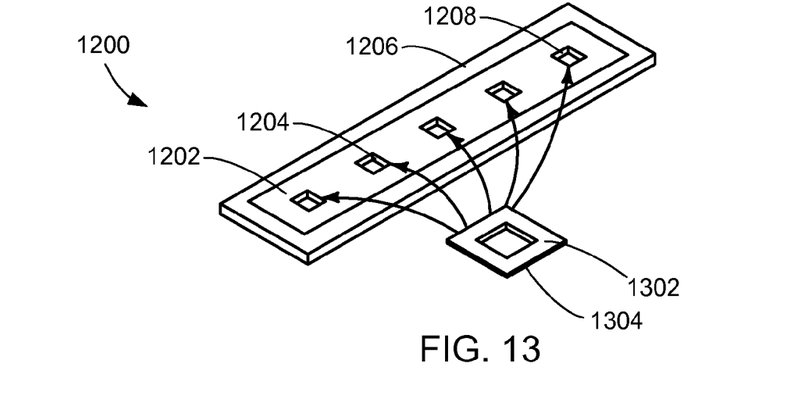
FIG. 13 is an isometric view of the integrated circuit package system in a die pad mounting phase.

Referring now to FIG. 13, therein is shown an isometric view of the integrated circuit package system 1200 in a die pad mounting phase. Down-set conductive die pads 1302 are placed over the attachment material (not shown) on the substrate 1202 over the jig 1206. The down-set conductive die pads 1302 include an exposed surface 1304. The exposed surface 1304 of the down-set conductive die pads 1302 is placed within the substrate cavity 1204 and the jig cavity 1208. The substrate 1202 and the down-set conductive die pads 1302 provide the mounting surfaces for the integrated circuit package system 1200.

Figure 14:
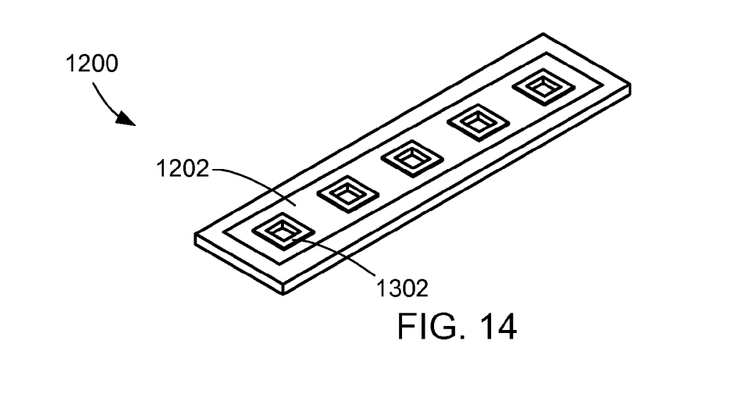
FIG. 14 is an isometric view of the integrated circuit package system in an attaching phase.

Referring now to FIG. 14, therein is shown an isometric view of the integrated circuit package system 1200 in an attaching phase. A clamping tool (not shown), such as a pick up tool, presses the substrate 1202 and the down-set conductive die pads 1302 together. The clamping tool ensures the attachment material (not shown) adheres to the substrate 1202 and the down-set conductive die pads 1302. The attachment material provides sufficient adhesive force between the substrate 1202 and each of the down-set conductive die pads 1302 to maintain attachment during further processing, such as singulation.

Figure 15:
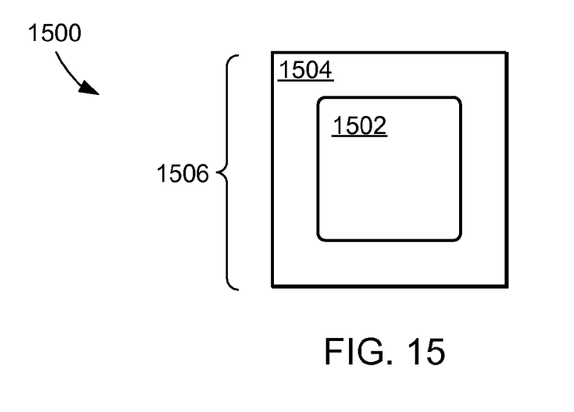
FIG. 15 is a plan view of a basic-type down-set conductive die pad in an embodiment of the present invention.

Referring now to FIG. 15, therein is shown a plan view of a basic-type down-set conductive die pad 1500 in an embodiment of the present invention. The basic-type down-set conductive die pad 1500 can be in the shape of a square or a rectangle. A lower region 1502 and an upper region 1504 form the basic-type down-set conductive die pad 1500. The lower region 1502 forms the die pad surface 106 of FIG. 1 and the exposed surface 108 of FIG. 1. The upper region 1504 forms a substrate mounting region. The upper region 1504 is also adjacent to lead fingers (not shown). The lead fingers are formed in a finger region 1506 outside the perimeter of the basic-type down-set conductive die pad 1500.

Figure 16:
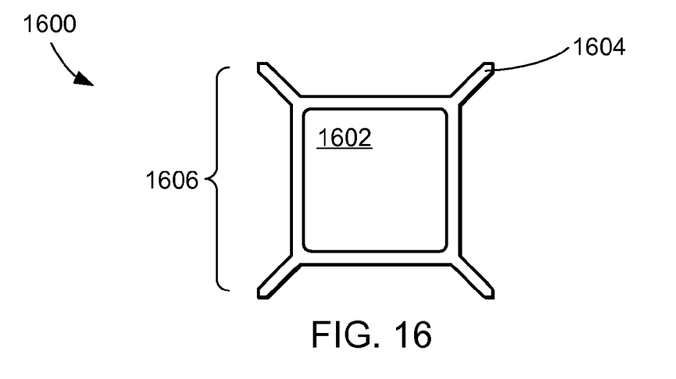
FIG. 16 is a plan view of a bridge-type down-set conductive die pad in an embodiment of the present invention.

Referring now to FIG. 16, therein is shown a plan view of a bridge-type down-set conductive die pad 1600 in an embodiment of the present invention. The bridge-type down-set conductive die pad 1600 can be in the shape of a square or a rectangle. A lower region 1602 and an upper region 1604 form the bridge-type down-set conductive die pad 1600. The lower region 1602 forms the die pad surface 106 of FIG. 1 and the exposed surface 108 of FIG. 1. The upper region 1604 forms a substrate mounting region. The upper region 1604 is also adjacent to lead fingers (not shown). The lead fingers are formed in a finger region 1606 within the upper region 1604 of the bridge-type down-set conductive die pad 1600.

Figure 17:
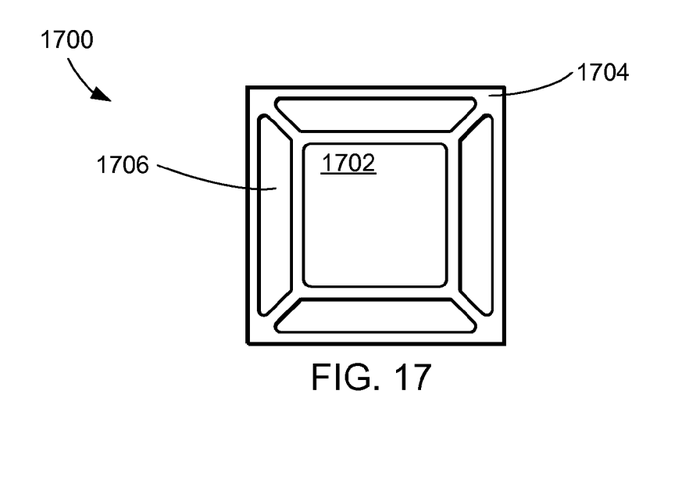
FIG. 17 is a plan view of a window-type down-set conductive die pad in an embodiment of the present invention.

Referring now to FIG. 17, therein is shown a plan view of a window-type down-set conductive die pad 1700 in an embodiment of the present invention. The window-type down-set conductive die pad 1700 can be in the shape of a square or a rectangle. A lower region 1702 and an upper region 1704 form the window-type down-set conductive die pad 1700. The lower region 1702 forms the die pad surface 106 of FIG. 1 and the exposed surface 108 of FIG. 1. The upper region 1704 forms a substrate mounting region. The upper region 1704 is also adjacent to lead fingers (not shown). The lead fingers are formed in a finger region 1706 within the upper region 1704 of the window-type down-set conductive die pad 1700.

Figure 18:
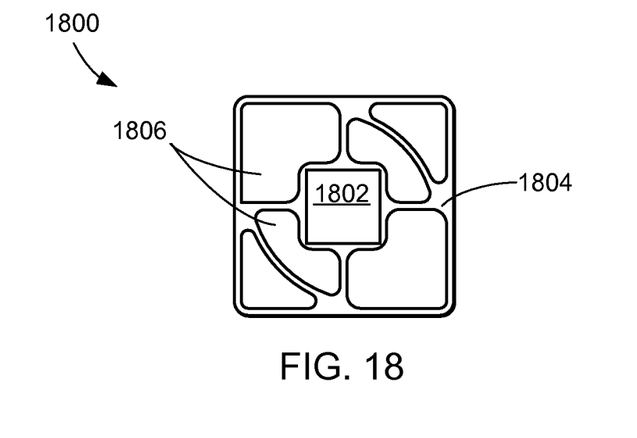
FIG. 18 is a plan view of a double-window-type down-set conductive die pad in an embodiment of the present invention.

Referring now to FIG. 18, therein is shown a plan view of a double-window-type down-set conductive die pad 1800 in an embodiment of the present invention. The double-window-type down-set conductive die pad 1800 can be in the shape of a square or a rectangle. A lower region 1802 and an upper region 1804 form the double-window-type down-set conductive die pad 1800. The lower region 1802 forms the die pad surface 106 of FIG. 1 and the exposed surface 108 of FIG. 1. The upper region 1804 forms a substrate mounting region. The upper region 1804 is also adjacent to lead fingers (not shown). The lead fingers are formed in a finger region 1806 within the upper region 1804 of the double-window-type down-set conductive die pad 1800.

The upper region 1804 can also provide significantly improved area up to extents of a package. It has been discovered that the double-window-type down-set conductive die pad 1800 provides improved thermal performance.

Figure 19:
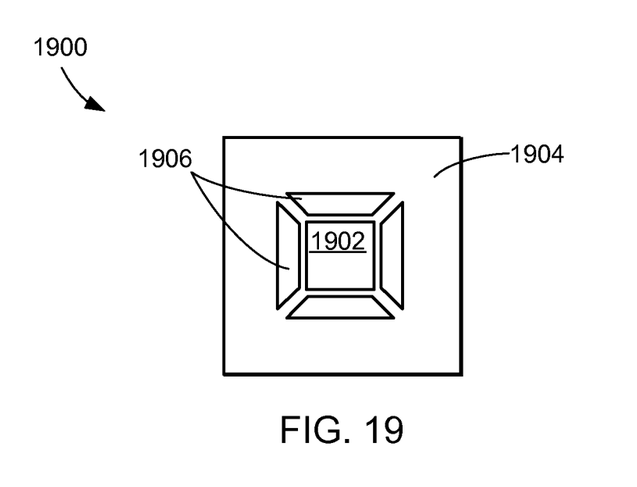
FIG. 19 is a plan view of a wide-type down-set conductive die pad in an embodiment of the present invention.

Referring now to FIG. 19, therein is shown a plan view of a wide-type down-set conductive die pad 1900 in an embodiment of the present invention. The wide-type down-set conductive die pad 1900 can be in the shape of a square or a rectangle. A lower region 1902 and an upper region 1904 form the wide-type down-set conductive die pad 1900. The lower region 1902 forms the die pad surface 106 of FIG. 1 and the exposed surface 108 of FIG. 1. The upper region 1904 forms a substrate mounting region. The upper region 1904 is also adjacent to lead fingers (not shown). The lead fingers are formed in a finger region 1906 within the upper region 1904 of the wide-type down-set conductive die pad 1900.

The upper region 1904 can also provide significantly improved area up to extents of a package. It has been discovered that the wide-type down-set conductive die pad 1900 provides improved thermal performance.

Figure 20:
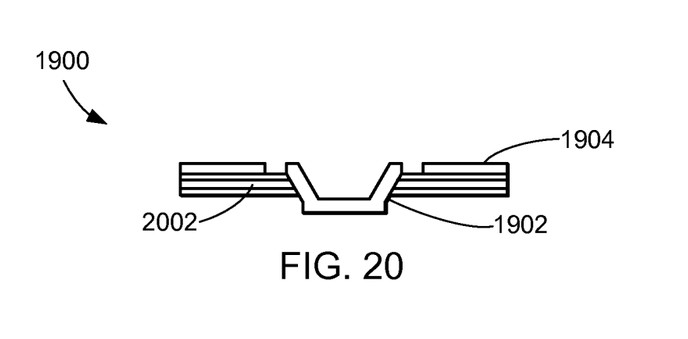
FIG. 20 is a cross-sectional view of a cross-sectional view of the wide-type down-set conductive die pad.

Referring now to FIG. 20, therein is shown a cross-sectional view of the wide-type down-set conductive die pad 1900. The lower region 1902 and the upper region 1904 form the wide-type down-set conductive die pad 1900. The lower region 1902 forms the die pad surface 106 of FIG. 1 and the exposed surface 108 of FIG. 1. The upper region 1904 forms a substrate mounting region over a package substrate 2002. The upper region 1904 can also provide significantly improved area up to extents of a package, such as the package substrate 2002. It has been discovered that the wide-type down-set conductive die pad 1900 provides improved thermal performance.

Figure 21:
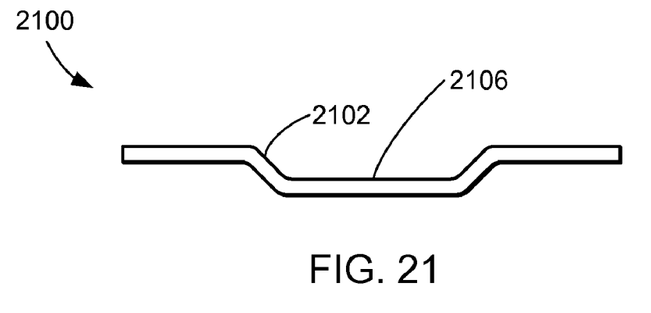
FIG. 21 is a cross-sectional view of a single-type down-set conductive die pad in an embodiment of the present invention.

Referring now to FIG. 21, therein is shown a cross-sectional view of a single-type down-set conductive die pad 2100 in an embodiment of the present invention. The single-type down-set conductive die pad 2100 includes one of a down-set step 2102. The down-set step 2102 releases stress concentrated on a die pad surface 2106 due to adhesive strength of the die attach material 116 of FIG. 1. Concentrated stress during processing can damage the single-type down-set conductive die pad 2100.

Figure 22:
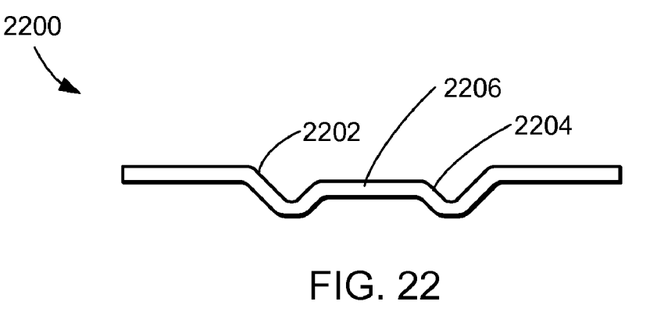
FIG. 22 is a cross-sectional view of a combine-type down-set conductive die pad in an embodiment of the present invention.

Referring now to FIG. 22, therein is shown a cross-sectional view of a combine-type down-set conductive die pad 2200 in an embodiment of the present invention. The combine-type down-set conductive die pad 2200 includes a down-set step 2202 and an upward-set step 2204. The down-set step 2202 and the upward-set step 2204 significantly release stress concentrated on a die pad surface 2206 due to adhesive strength of the die attach material 116 of FIG. 1. Concentrated stress during processing can damage the combine-type down-set conductive die pad 2200.

Figure 23:
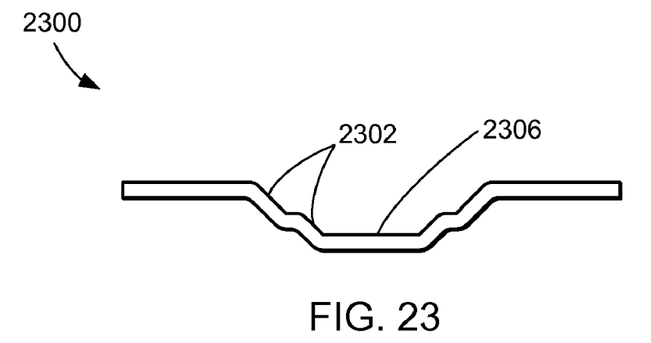
FIG. 23 is a cross-sectional view of a double-type down-set conductive die pad in an embodiment of the present invention.

Referring now to FIG. 23, therein is shown a cross-sectional view of a double-type down-set conductive die pad 2300 in an embodiment of the present invention. The double-type down-set conductive die pad 2300 includes down-set steps 2302. The down-set steps 2302 significantly release stress concentrated on a die pad surface 2306 due to adhesive strength of the die attach material 116 of FIG. 1. Concentrated stress during processing can damage the double-type down-set conductive die pad 2300.

Figure 24:
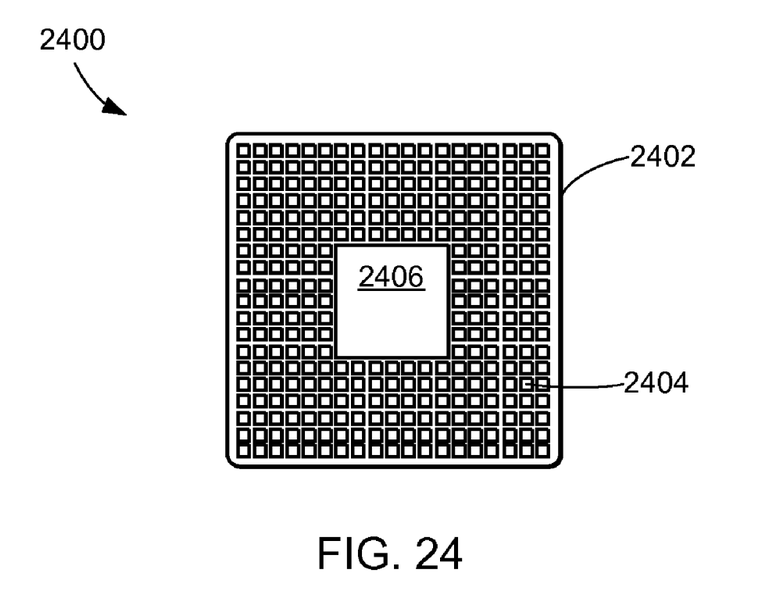
FIG. 24 is a top view of a down-set conductive die pad in an embodiment of the present invention.

Referring now to FIG. 24, therein is shown a top view of a down-set conductive die pad 2400 in an embodiment of the present invention. The down-set conductive die pad 2400 includes a die pad surface 2402 having a pattern 2404, such as dimples or etching. The die pad surface 2402 can be patterned by chemical processing, such as an oxide treatment, or mechanical processing, such as dimpling. The pattern 2404 provides improved encapsulant adhesion between the encapsulant 120 of FIG. 1 and the down-set conductive die pad 2400. The pattern 2404 may not provide an improvement for a lower region 2406.

Figure 25:
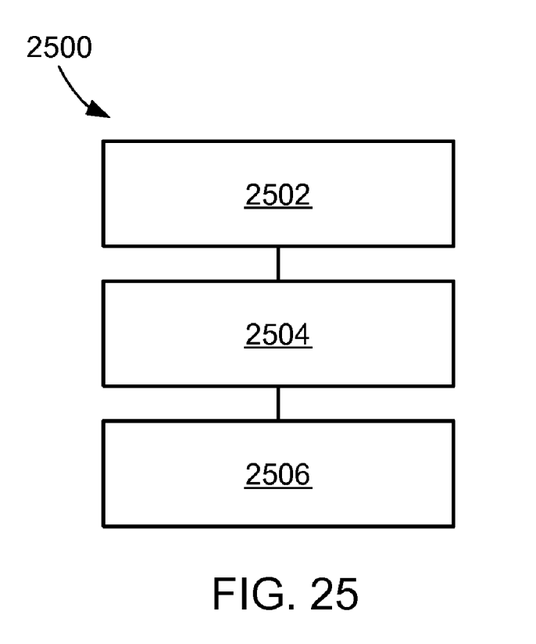
FIG. 25 is a flow chart of an integrated circuit package system for manufacturing the integrated circuit package system in an embodiment of the present invention.

Referring now to FIG. 25 is a flow chart of an integrated circuit package system 2500 for manufacturing the integrated circuit package system 100 in an embodiment of the present invention. The system 2500 includes providing a substrate in a block 2502; attaching a down-set conductive die pad on the substrate in a block 2504; and attaching an integrated circuit over the down-set conductive die pad in a block 2506.

In greater detail, a method to fabricate the integrated circuit package system 100, in an embodiment of the present invention, is performed as follows:
1. Forming a substrate having a cavity. (FIG. 1)
2. Attaching a down-set conductive die pad in the cavity of the substrate. (FIG. 1)
3. Attaching an integrated circuit over the down-set conductive die pad in the cavity of the substrate; and
4. Applying an encapsulant over the integrated circuit with a surface of the down-set conductive die pad exposed. (FIG. 1)

It has been discovered that the present invention thus has numerous aspects.

An aspect is that the present invention provides the down-set conductive die pad. The down-set conductive die pad is formed from a conductive material. The down-set conductive die pad includes down-set steps and optional upward-set steps. The down-set steps and upward-set steps result in the die pad surface below the upper surface of the substrate.

Another aspect is that the present invention provides the exposed surface of the down-set conductive die pad. The exposed surface is on a side opposite the die pad surface on the lower region of the down-set conductive die pad.

Another aspect is that the present invention provides the substrate mounting region of the down-set conductive die pad. The die pad surface is on a side opposite the die pad surface on the upper region of the down-set conductive die pad.

It has been discovered that the disclosed structure provide improved thermal performance. The exposed surface of the down-set conductive die pad provides significantly improved thermal performance through heat transfer from the package including the integrated circuit.

It has also been discovered that the disclosed structure provides an improved package profile. The die pad surface below the upper surface of the substrate provides a recess for the integrated circuits within the profile of the substrate. The improved height of the die connectors provides significantly improves package profile.

Yet another discovery is that that the disclosed structure provides stacking of packages. Multiple packages may be stacked one over the other rather than the attachment on the same planar or largely the same planar surface. The stacking increases the typically smaller height dimension rather than increasing the typically larger planar dimension resulting in size and performance improvements.

Yet another discovery is that that the disclosed structure provides stacking of integrated circuit die. The integrated circuit die can be stacked within a package that in turn can be stacked. Stacking the integrated circuit die within the package provides additional improvements in size and performance. The integrated circuit die can be stacked in the typically smaller dimension rather than mounted adjacent to one another across the typically larger planar dimension.

Yet another discovery of the disclosed structure is that many types of integrated circuits, such as passive devices, integrated circuits, integrated circuits with integrated passives, or top heat sinks, can be integrated. The substrate provides compatibility with many and varied components including varied functions, dimensions, and connection configurations.

Yet another discovery of the disclosed structure is that improved electrical performance is provided by the shield. The shield provides improved electrical performance particularly when a ground signal is attached, such as metal pads or copper on substrate.

Yet another discovery of the disclosed structure is compatibility with various substrate types. The down-set conductive die pad is compatible with various assembly processes and can be attached to several substrates, such as lamination or build-up.

Yet another discovery of the disclosed structure is compatibility with qualified assembly technology. The use of qualified assembly technology can improve development costs and development time.

These and other valuable aspects of the present invention consequently further the state of the technology to at least the next level.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a substrate with a beveled cavity;
   attaching a down-set conductive die pad with tapered sidewalls for matching with the beveled cavity in the substrate and having the down-set below a lower surface of the substrate; and
   attaching an integrated circuit over the down-set conductive die pad and electrically connected thereto.

2. The method as claimed in claim 1 wherein attaching the down-set conductive die pad comprises:
   forming substrate connectors having lower extents in a plane; and
   forming an exposed surface of the down-set conductive die pad substantially coplanar with the plane of the lower extent of the substrate connectors.

3. The method as claimed in claim 1 wherein providing the down-set conductive die pad comprises:
   forming substrate connectors having lower extents in a plane; and
   forming an exposed surface of the down-set conductive die pad with an offset above the plane of the lower extent of the substrate connectors.

4. The method as claimed in claim 1 further comprising attaching another integrated circuit package system over the integrated circuit package system.

5. The method as claimed in claim 1 further comprising attaching passive devices on the substrate.

6. A method for manufacturing an integrated circuit package system comprising:
   forming a substrate having a beveled cavity;
   attaching a down-set conductive die pad with tapered sidewalls for matching with the beveled cavity of the substrate and having the down-set below a lower surface of the substrate;
   attaching an integrated circuit over the down-set conductive die pad in the beveled cavity of the substrate, the integrated circuit electrically connected to the down-set conductive die pad; and
   applying an encapsulant over the integrated circuit with a surface of the down-set conductive die pad exposed.

7. The method as claimed in claim 6 further comprising attaching a shield over the integrated circuit for electrical shielding.

8. The method as claimed in claim 6 further comprising attaching a heat sink over the integrated circuit for heat transfer.

9. The method as claimed in claim 6 wherein forming the down-set conductive die pad comprises forming a bridge-type down-set conductive die pad providing space for the integrated circuit connection.

10. The method as claimed in claim 6 wherein forming the down-set conductive die pad comprises forming a window-type down-set conductive die pad providing space for the integrated circuit connection.

11. An integrated circuit package system comprising:
    a substrate with a beveled cavity;
    a down-set conductive die pad with tapered sidewalls matched with the beveled cavity in the substrate and having the down-set below a lower surface of the substrate; and
    an integrated circuit over the down-set conductive die and electrically connected thereto.

12. The system as claimed in claim 11 wherein the down-set conductive die pad comprises:
    substrate connectors having lower extents in a plane; and
    an exposed surface of the down-set conductive die pad substantially coplanar with the plane of the lower extents of the substrate connectors.

13. The system as claimed in claim 11 wherein the down-set conductive die pad comprises:
   substrate connectors having lower extents in a plane; and
   an exposed surface of the down-set conductive die pad with an offset above the plane of the lower extents of the substrate connectors.

14. The system as claimed in claim 11 further comprising another integrated circuit package system over the integrated circuit package system.

15. The system as claimed in claim 11 further comprising passive devices on the substrate.

16. The system as claimed in claim 11 wherein:
   the down-set die pad with tapered sidewalls is matched in the beveled cavity of the substrate;
   the integrated circuit is over the down-set conductive die pad in the beveled cavity of the substrate; and
   further comprising:
   an encapsulant is over the integrated circuit with a surface of the down-set conductive die pad exposed.

17. The system as claimed in claim 16 further comprising a shield over the integrated circuit for electrical shielding.

18. The system as claimed in claim 16 further comprising a heat sink over the integrated circuit for heat transfer.

19. The system as claimed in claim 16 wherein the down-set conductive die pad comprises a bridge-type down-set conductive die pad providing space for the integrated circuit connection.

20. The system as claimed in claim 16 wherein the down-set conductive die pad comprises a window-type down-set conductive die pad providing space for the integrated circuit connection.

* * * * *